(12) United States Patent
Inuzuka et al.

(10) Patent No.: US 10,734,075 B2
(45) Date of Patent: Aug. 4, 2020

(54) SEMICONDUCTOR STORAGE DEVICE AND METHOD OF READING DATA THEREFROM

(71) Applicant: Toshiba Memory Corporation, Tokyo (JP)

(72) Inventors: Yuki Inuzuka, Yokohama Kanagawa (JP); Takaaki Nakazato, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/285,104

(22) Filed: Feb. 25, 2019

(65) Prior Publication Data

US 2020/0082880 A1 Mar. 12, 2020

(30) Foreign Application Priority Data

Sep. 6, 2018 (JP) .................................. 2018-166584

(51) Int. Cl.
*G11C 11/00* (2006.01)
*G11C 13/00* (2006.01)
(Continued)

(52) U.S. Cl.
CPC ........ *G11C 13/004* (2013.01); *G11C 13/0004* (2013.01); *H01L 27/2409* (2013.01);
(Continued)

(58) Field of Classification Search
CPC . H01L 27/2463; H01L 27/2481; H01L 45/08; H01L 45/12; H01L 45/1233; H01L 45/146; G11C 13/0007; G11C 13/0069; G11C 2213/72; G11C 13/0002; G11C 13/004; G11C 13/003; G11C 2213/71;
(Continued)

(56) References Cited

U.S. PATENT DOCUMENTS

2006/0028247 A1 2/2006 Hara et al.
2008/0191188 A1 8/2008 Jeong
(Continued)

FOREIGN PATENT DOCUMENTS

JP 2006048298 A 2/2006
JP 2006108645 A 4/2006
(Continued)

*Primary Examiner* — Thong Q Le
(74) *Attorney, Agent, or Firm* — Kim & Stewart LLP

(57) ABSTRACT

A semiconductor storage device includes a memory cell having a first variable resistance element changeable from a first state to a second state at which a resistance value of the first variable resistance element is higher than that of the first variable resistance element at the first state, and a second variable resistance element connected to the first variable resistance element in series and changeable from a third state to a fourth state at which a resistance value of the second variable resistance element is higher than that of the second variable resistance element at the third state. In the memory cell, a first snapback occurs at a first threshold current and a first threshold voltage, and a second snapback occurs at a second threshold current that is greater than the first threshold current and a second threshold voltage that is greater than the first threshold voltage.

22 Claims, 15 Drawing Sheets

(51) Int. Cl.
*H01L 27/24* (2006.01)
*H01L 45/00* (2006.01)
*G11C 11/56* (2006.01)

(52) U.S. Cl.
CPC .......... *H01L 27/2481* (2013.01); *H01L 45/06* (2013.01); *G11C 11/5678* (2013.01); *G11C 13/0026* (2013.01); *G11C 13/0028* (2013.01); *G11C 2013/0045* (2013.01); *G11C 2213/15* (2013.01); *G11C 2213/72* (2013.01); *H01L 45/1233* (2013.01); *H01L 45/141* (2013.01)

(58) Field of Classification Search
CPC ............ G11C 2213/15; G11C 2213/78; G11C 13/0023; G11C 13/0064
USPC ................ 257/5, 2; 438/381, 382, 486, 631; 365/148, 163, 100, 158, 175, 189.07, 46
See application file for complete search history.

(56) References Cited

U.S. PATENT DOCUMENTS

| | | |
|---|---|---|
| 2008/0273378 A1 | 11/2008 | Philipp et al. |
| 2010/0214811 A1 | 8/2010 | Franceschini et al. |
| 2012/0287706 A1 | 11/2012 | Lung |
| 2013/0256625 A1* | 10/2013 | Lee .................. H01L 45/12 257/5 |

FOREIGN PATENT DOCUMENTS

| | | |
|---|---|---|
| JP | 2008198979 A | 8/2008 |
| JP | 2012518860 A | 8/2012 |
| JP | 2018067365 A | 4/2018 |
| TW | I466118 B | 12/2014 |

* cited by examiner

FIG. 10
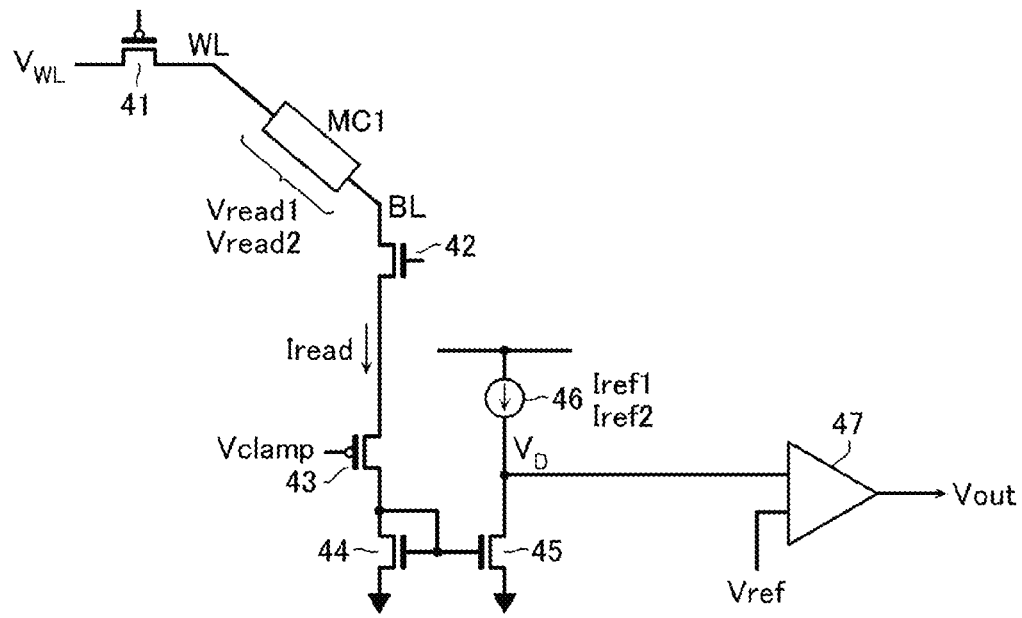
FIG. 11A
(a) WRITE OF DATA "00" (PCM1: HRS, PCM2: HRS)
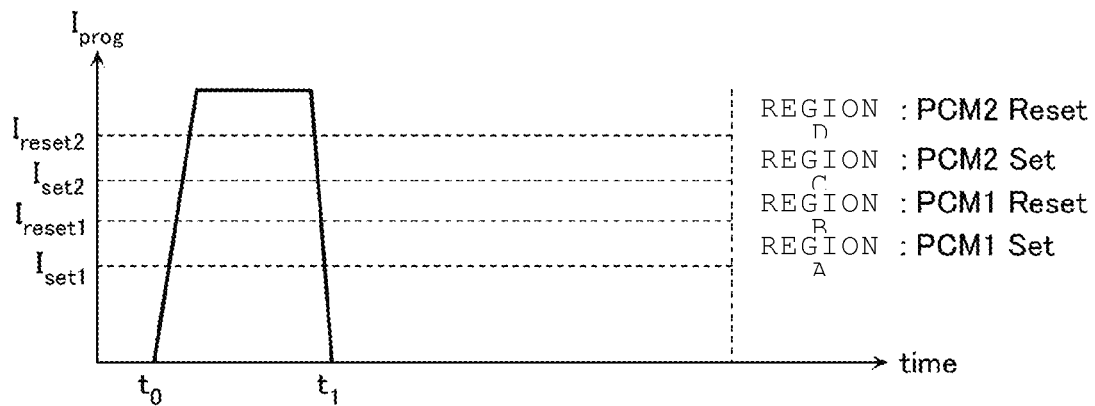
(b) WRITE OF DATA "01" (PCM1: HRS, PCM2: LRS)
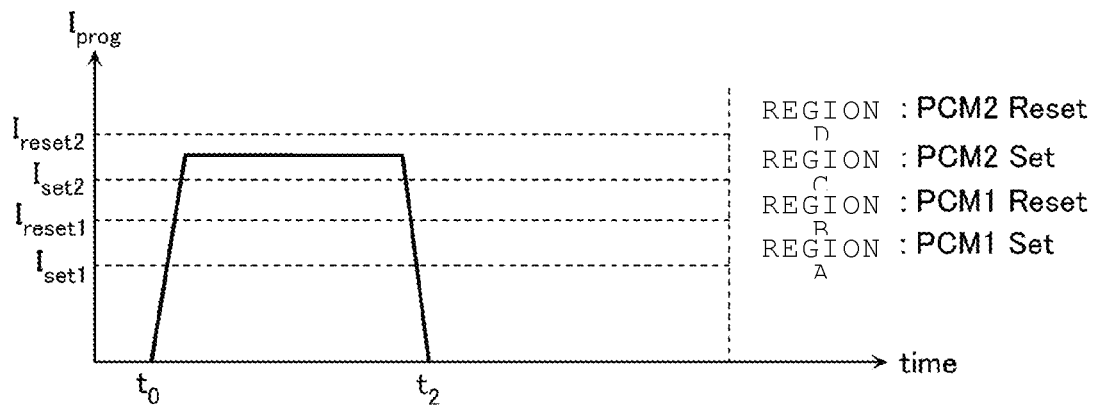

FIG. 11B
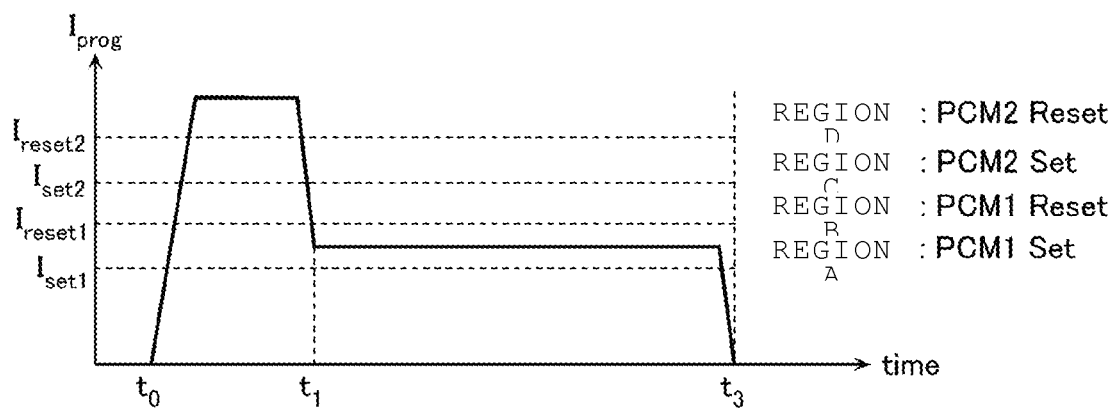
(c) WRITE OF DATA "10" (PCM1: LRS, PCM2: HRS)
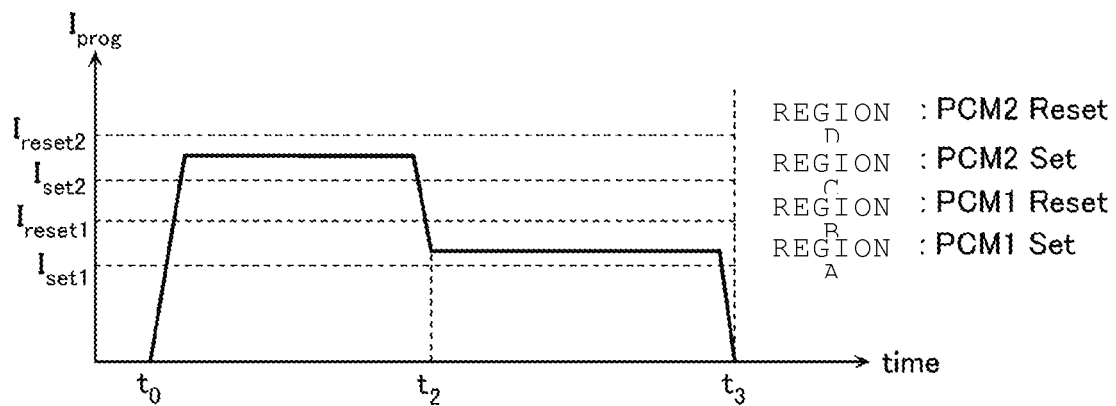
(d) WRITE OF DATA "11" (PCM1: LRS, PCM2: LRS)

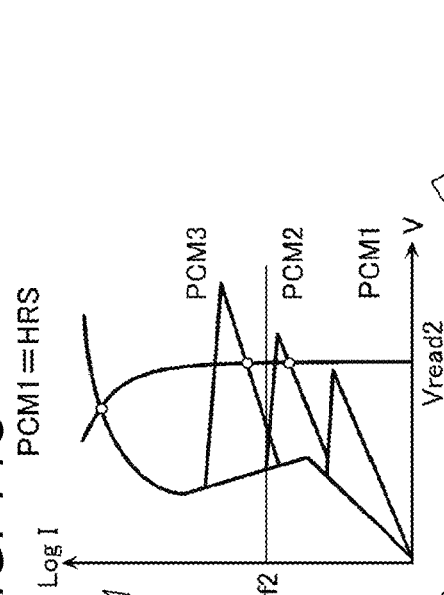
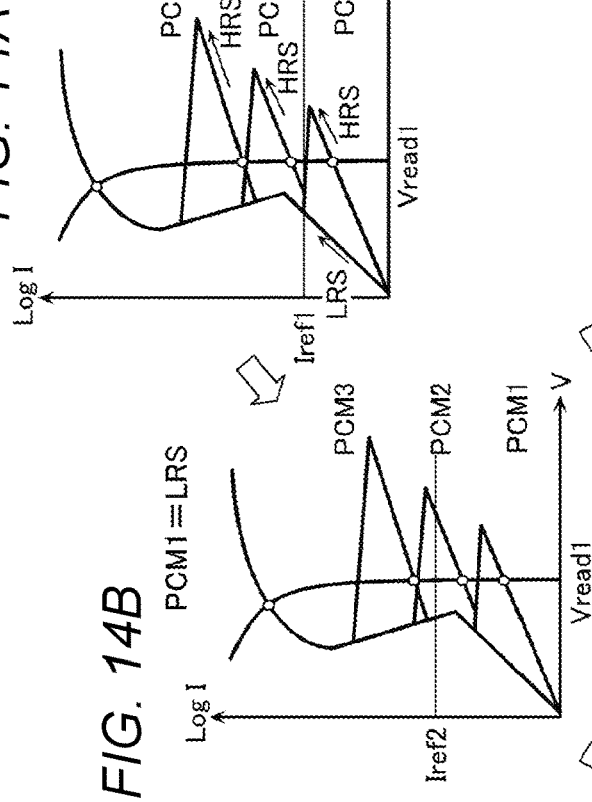
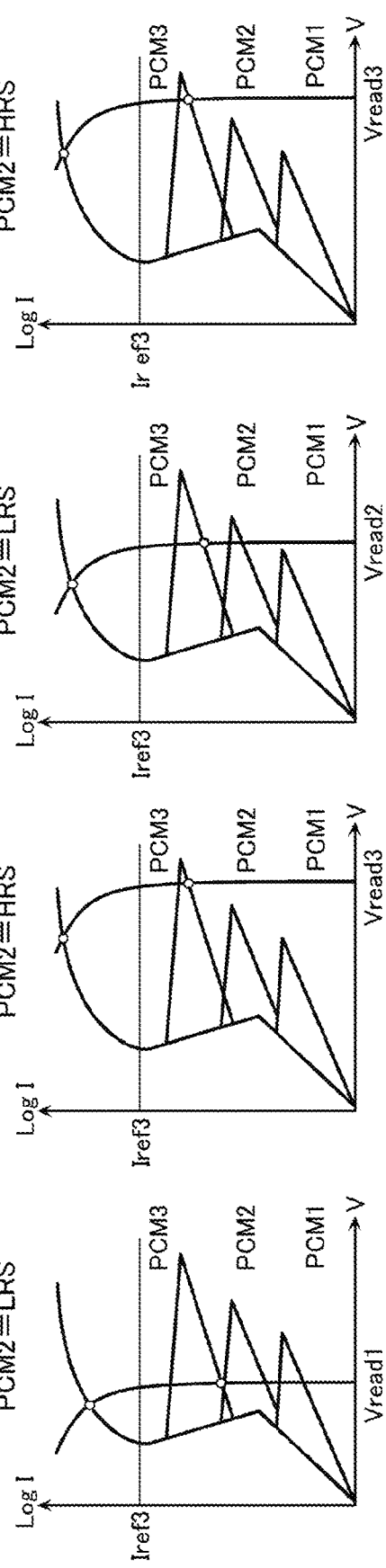

| PCM1 | PCM2 | DATA |
|------|------|------|
| LRS  | LRS  | X    |
| LRS  | HRS  | 0    |
| HRS  | LRS  | 1    |
| HRS  | HRS  | N/A  |

# SEMICONDUCTOR STORAGE DEVICE AND METHOD OF READING DATA THEREFROM

CROSS-REFERENCE TO RELATED APPLICATION

This application is based upon and claims the benefit of priority from Japanese Patent Application No. 2018-166584, filed Sep. 6, 2018, the entire contents of which are incorporated herein by reference.

FIELD

Embodiments described herein relate generally to a semiconductor storage device and a method of reading data therefrom.

BACKGROUND

A phase change memory (PCM) is a resistance-change type semiconductor storage device that stores information by changing a resistance value of a memory cell, and is known as a large capacity semiconductor storage device. In addition, among semiconductor storage devices, a semiconductor storage device that stores data of multiple bits by using a plurality of variable resistance films in one memory cell in order to further improve storage capacity is known.

DESCRIPTION OF THE DRAWINGS

FIG. 10 is a circuit diagram illustrating a read circuit usable for the read operation.

FIG. 11A is a current waveform diagram illustrating a write operation in the semiconductor storage device.

FIG. 11B is a current waveform diagram illustrating another write operation in the semiconductor storage device.

FIGS. 14A to 14G are each a diagram illustrating a relationship between data stored in the memory cell and the current-voltage characteristic.

DETAILED DESCRIPTION

Figure 1:
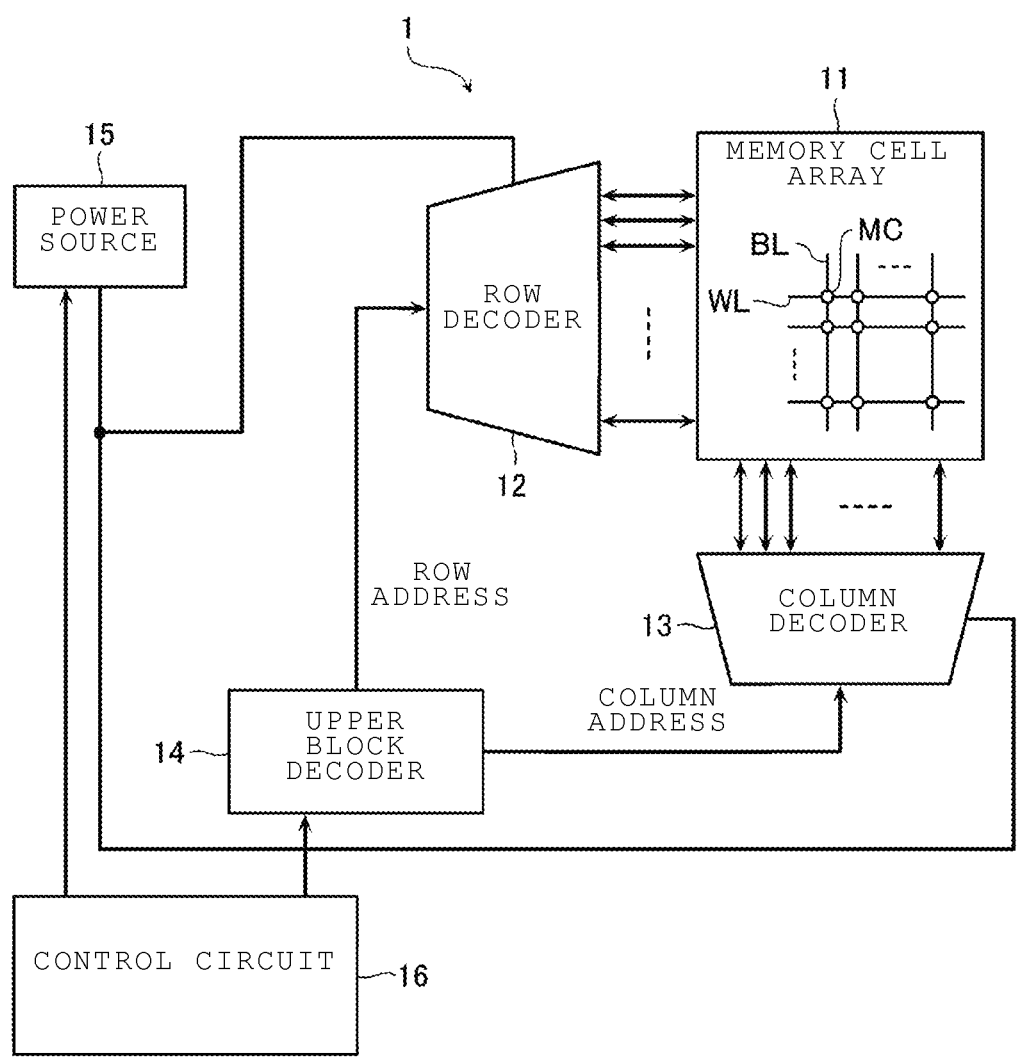
FIG. 1 is a block diagram of a semiconductor storage device according to a first embodiment.

Embodiments provide a semiconductor storage device with increased storage capacity and a method of reading data therefrom.

According to one embodiment, a semiconductor storage device includes a memory cell having a first variable resistance element changeable from a first state to a second state at which a resistance value of the first variable resistance element is higher than that of the first variable resistance element at the first state, and a second variable resistance element connected to the first resistance-variable element in series and changeable from a third state to a fourth state at which a resistance value of the second variable resistance element is higher than that of the second variable resistance element at the third state. In the memory cell, a first snapback occurs at a first threshold current and a first threshold voltage, and a second snapback occurs at a second threshold current that is greater than the first threshold current and a second threshold voltage that is greater than the first threshold voltage.

In a method of reading data from a semiconductor storage device according to an embodiment, a first read current flowing through the memory cell is detected, when a first read voltage greater than the voltages at the both ends of the memory cell when the first threshold current flows through the memory cell and less than the first threshold voltage when the first variable resistance element is in the first state is applied to the memory cell. It is determined that the first variable resistance element is in the first state when the first read current is greater than a first reference current approximately equal to the first threshold current. In this case, the first read current is compared with a second reference current approximately equal to the second threshold current while applying the first read voltage to the memory cell, it is determined that the second variable resistance element is in the third state when the first read current is greater than the second reference current, and it is determined that the second variable resistance element is in the fourth state when the first read current is equal to or less than the second reference current.

It is determined that the first variable resistance element is in the second state when the first read current is equal to or less than the first reference current. In this case, a second read voltage greater than the first threshold voltage and less than the second threshold voltage is applied to the memory cell to detect a second read current flowing through the memory cell, it is determined that the second variable resistance element is in the third state when the second read current is greater than the second reference current, and it is determined that the second variable resistance element is in the fourth state when the second read current is equal to or less than the second reference current.

Hereinafter, a semiconductor storage device according to an embodiment will be described in detail with reference to the drawings. It is noted that the following embodiments are merely examples and are not intended to limit the present disclosure.

[First Embodiment]
[Configuration]

FIG. 1 is a block diagram of a semiconductor storage device according to a first embodiment.

A semiconductor storage device 1 according to the present embodiment includes a memory cell array 11, a row decoder 12 and a column decoder 13, for selecting a desired memory cell MC from the memory cell array 11, an upper block decoder 14 that supplies a row address and a column address to the decoders 12 and 13, a power source 15 that supplies power to each unit of the semiconductor storage device 1, and a control circuit 16 that controls the memory cell array 11, the row decoder 12, the column decoder 13, the upper block decoder 14, and the power source 15.

The memory cell array 11 includes a plurality of memory cells MC that stores a multi-bit data (i.e., data represented by a plurality of bits). The memory cell array 11 is configured so that the desired memory cell MC is able to be accessed (for data write/data read) by applying a predetermined voltage to a desired bit line BL and a desired word line WL selected by the row decoder 12 and the column decoder 13.

Figure 2:
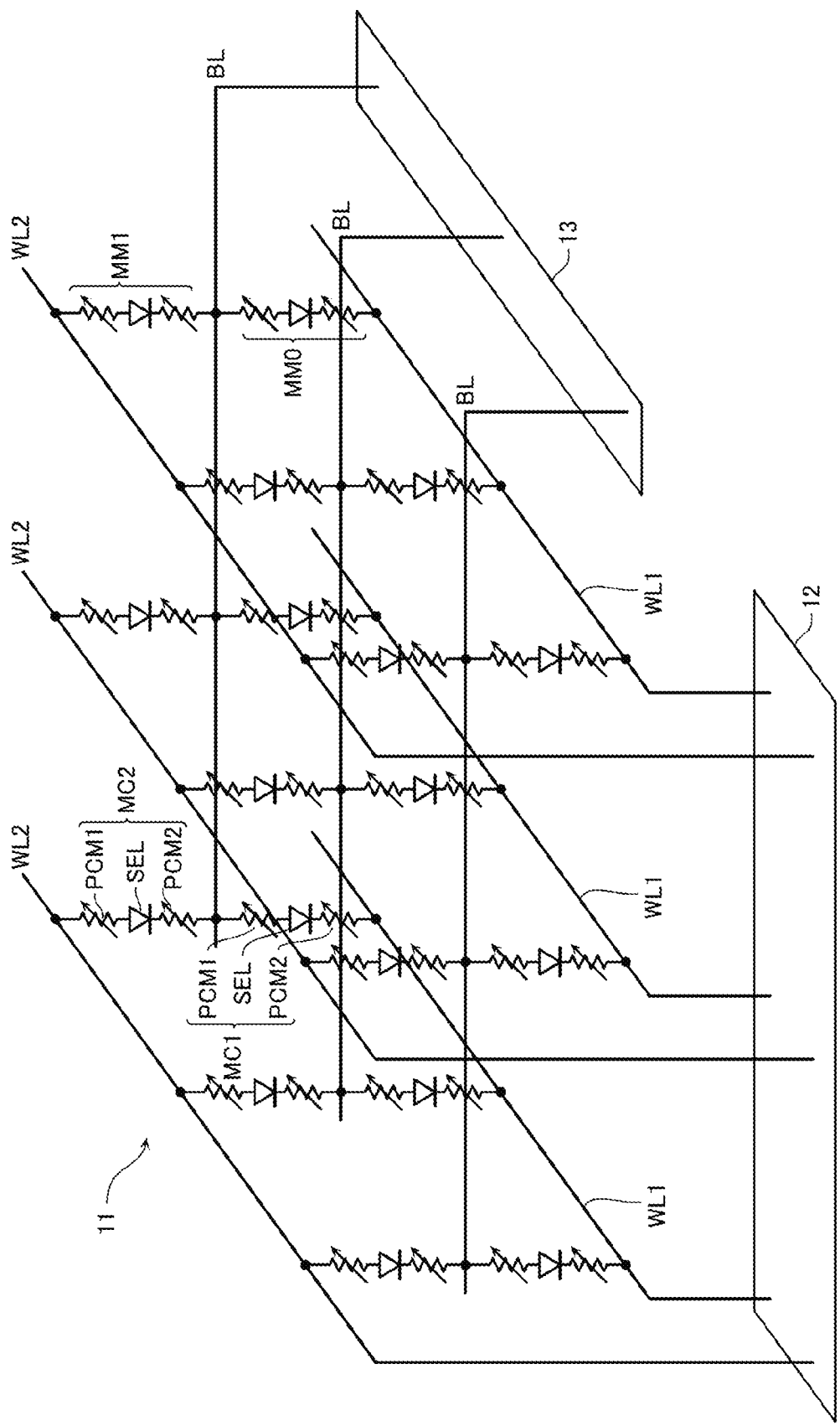
FIG. 2 is a circuit diagram illustrating a configuration of a memory cell array of the semiconductor storage device.

FIG. 2 is an equivalent circuit diagram illustrating a configuration of a part of the memory cell array 11.

The memory cell array 11 includes a plurality of bit lines BL, a plurality of word lines WL1 and WL2, and a plurality of memory cells MC1 and MC2 connected to the bit lines BL and the word lines WL1 and WL2.

The memory cells MC1 and MC2 are connected to the row decoder 12 through the word lines WL1 and WL2, and are also connected to the column decoder 13 through the bit line BL. Each of the memory cells MC1 and MC2 stores multi-bit data, in this example, 2 bits. In addition, the plurality of memory cells MC1 and MC2 connected to the common word lines WL1 and WL2 store, for example, data for one page.

The memory cells MC1 and MC2 each include a series circuit of a first variable resistance film PCM1 that is a first variable resistance element, a selector SEL, and a second variable resistance film PCM2 that is a second variable resistance element. For example, the first and second variable resistance films PCM1 and PCM2 are formed by a phase change film capable of having two states of a low resistance crystalline state and a high resistance amorphous state according to a supplied current pattern. It is possible to cause the first and second variable resistance films PCM1 and PCM2 to function as the memory cells by causing the state of the two types of resistance values to correspond to information of "0" and "1". In addition, the selector SEL of the memory cells MC1 and MC2 functions as a rectifying element. Therefore, almost no current flows through the word lines other than the selected word lines.

It is noted that, in the following description, a configuration including the plurality of bit lines BL, the plurality of word lines WL1, and the plurality of memory cells MC1 corresponding to a first layer of the memory cell array 11 is referred to as a memory matrix MM0. Similarly, a configuration including the plurality of bit lines BL, the plurality of word lines WL2, and the plurality of memory cells MC2 corresponding to a second layer of the memory cell array 11 is referred to as a memory matrix MM1.

Figure 3:
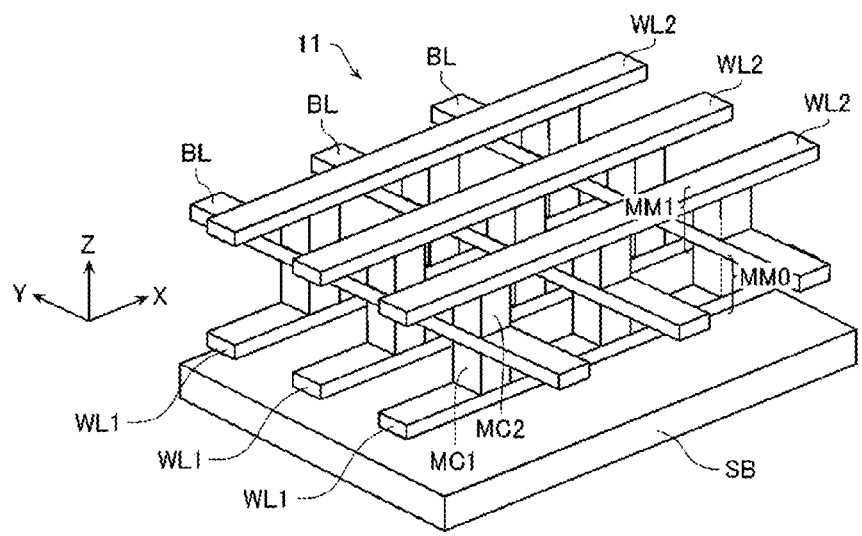
FIG. 3 is a perspective view illustrating a configuration of the memory cell array.

FIG. 3 is a schematic perspective view illustrating a configuration of a part of the memory cell array 11.

In this example, the memory cell array 11 is a so-called cross-point type memory cell array. That is, above a semiconductor substrate SB, the plurality of word lines WL1 that are disposed at predetermined intervals in a Y direction parallel to an upper surface of the semiconductor substrate SB and extend in parallel in an X direction parallel to the upper surface of the semiconductor substrate SB and intersects with the Y direction, are provided. In addition, above the plurality of word lines WL1, the plurality of bit lines BL that are disposed at predetermined intervals in the X direction and extend in parallel in the Y direction, are provided. Furthermore, above the plurality of bit lines BL, the plurality of word lines WL2 that are disposed at predetermined intervals in the Y direction and extend in parallel in the X direction, are provided. In addition, the memory cell MC1 is provided at each of intersections of the plurality of word lines WL1 and the plurality of bit lines BL. Similarly, the memory cell MC2 is provided at each of intersections of the plurality of bit lines BL and the plurality of word lines WL2. It is noted that, in this example, the memory cells MC1 and MC2 have a prism shape, but the memory cells MC1 and MC2 may have a columnar shape.

Figure 4A:
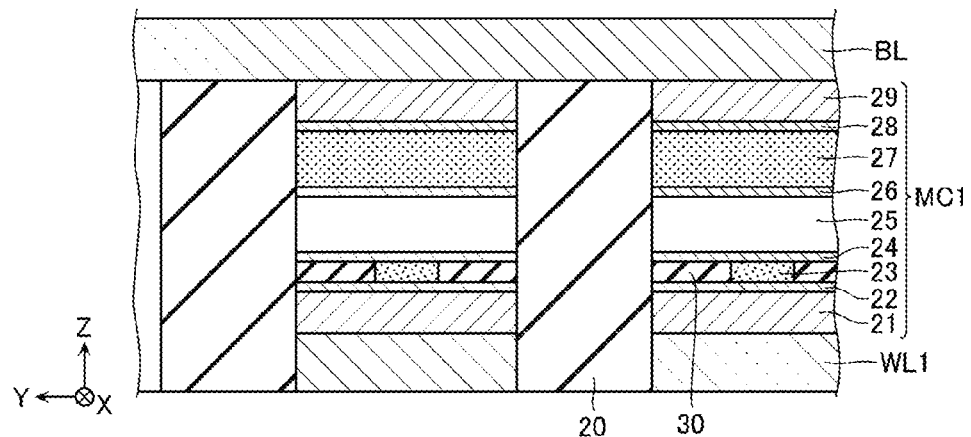
FIGS. 4A and 4B are cross-sectional views illustrating a configuration of a memory cell of the semiconductor storage device.
Figure 4B:
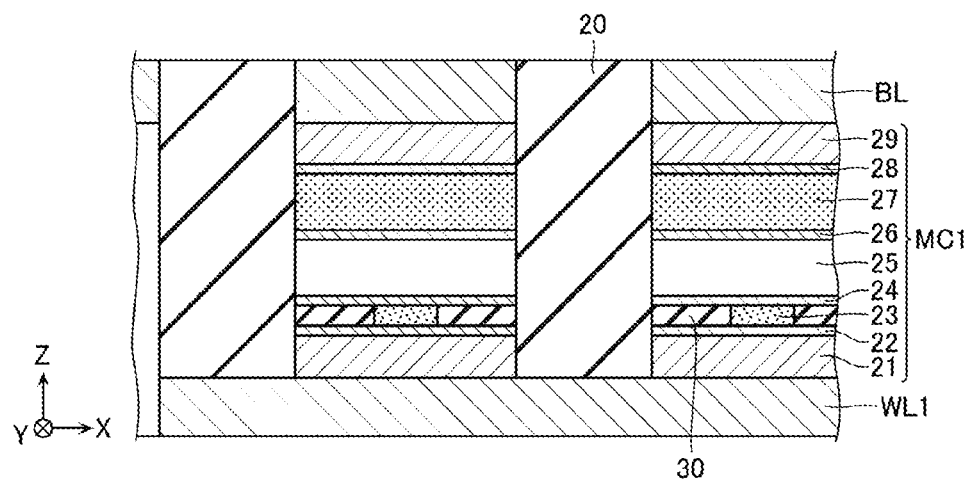

FIGS. 4A and 4B are cross-sectional views illustrating a configuration of a part of the memory matrix MM0. FIG. 4A shows a cross section orthogonal to the X direction, and FIG. 4B shows a cross section orthogonal to the Y direction. It is noted that, in the following description, a direction away from the semiconductor substrate SB (FIG. 3) in the Z direction may be referred to as an upper direction and a direction approaching the semiconductor substrate SB in the Z direction may be referred to as a lower direction.

The memory matrix MM0 includes the word line WL1 disposed on a side of the semiconductor substrate SB and extending in the X direction, the bit line BL disposed on a side of the word line WL1 opposite to the side of the semiconductor substrate SB and extending in the Y direction, the memory cell MC1 disposed between the word line WL1 and the bit line BL, and an insulating layer 20 provided between side surfaces of the plurality of memory cells MC1.

The memory cell MC1 includes a lower electrode layer 21, a barrier metal layer 22, a first variable resistance film (PCM1) 23, a barrier metal layer 24, a selector layer (SEL) 25, a barrier metal layer 26, a second variable resistance film (PCM2) 27, a barrier metal layer 28, and an upper electrode layer 29, that are sequentially stacked in the Z direction intersecting with the X direction and the Y direction in order from a side of the word line WL1 toward a side of the bit line BL. Physical characteristics of the first variable resistance film 23 and the second variable resistance film 27 are different from each other because their volumes are different from each other. Therefore, the insulating layer 30 is provided in a portion where the first variable resistance film 23 does not exist between the barrier metal layers 22 and 24. It is noted that, instead of or in addition to making the volumes of the first and second variable resistance films 23 and 27 be different from each other, the physical characteristics of the first variable resistance film 23 and the second variable resistance film 27 may be different from each other because they are made of materials that are different from each other.

For example, the word line WL1, the bit line BL, the lower electrode layer 21, and the upper electrode layer 29 include a conductive material such as tungsten (W), titanium (Ti), or poly Si. For example, the barrier metal layers 22, 24, 26, and 28 include a conductive material such as titanium nitride (TiN), tantalum (Ta), or tantalum nitride (TaN). In addition, a material having a high thermal resistance effect may also be used for heating of the first and second variable resistance films 23 and 27 in the electrode layers 21 and 29 and the barrier metal layers 22, 24, 26, and 28. For example, the selector layer 25 includes a non-ohmic element such as a pin diode including a p-type semiconductor layer, an intrinsic semiconductor layer, and an n-type semiconductor layer. For example, the insulating layers 20 and 30 include an insulator such as silicon oxide ($SiO_2$), or silicon nitride ($Si_3N_4$).

For example, the first and second variable resistance films 23 and 27 include a chalcogenide material such as a Ge-Sb-Te-based (GST-based) alloy including germanium (Ge), antimony (Sb), and tellurium (Te) or an In-Sb-Te-based (IST-based) alloy including indium (In), antimony (Sb), and tellurium (Te).

The first and second variable resistance films 23 and 27 are in an amorphous state (reset state: high resistance state) when they are heated to a temperature equal to or higher than a melting temperature and then subjected to rapid cooling. In addition, the first and second variable resistance films 23 and 27 are in a crystallized state (set state: low resistance state) when they are heated to a temperature lower than the melting temperature and higher than a crystallization temperature and then subjected to slow cooling. It is noted that, in this embodiment, the resistance value of the first variable resistance film 23 is greater than the resistance value of the second variable resistance film 27, and the melting temperature and the crystallization temperature of the first variable resistance film 23 are lower than the melting temperature and the crystallization temperature of the second variable resistance film 27, but such relationships may be reversed.

[Characteristic of Memory Cell]

Next, the physical characteristic of the memory cell MC1 in the present embodiment will be described. It is noted that, in the following description, the first variable resistance film 23 may be referred to as "PCM1", the second variable resistance film 27 may be referred to as "PCM2", a case where the PCM1 and the PCM2 are in a low resistance state may be referred to as "LRS", and a case where the PCM1 and the PCM2 are in a high resistance state may be referred to as "HRS".

Figure 5:
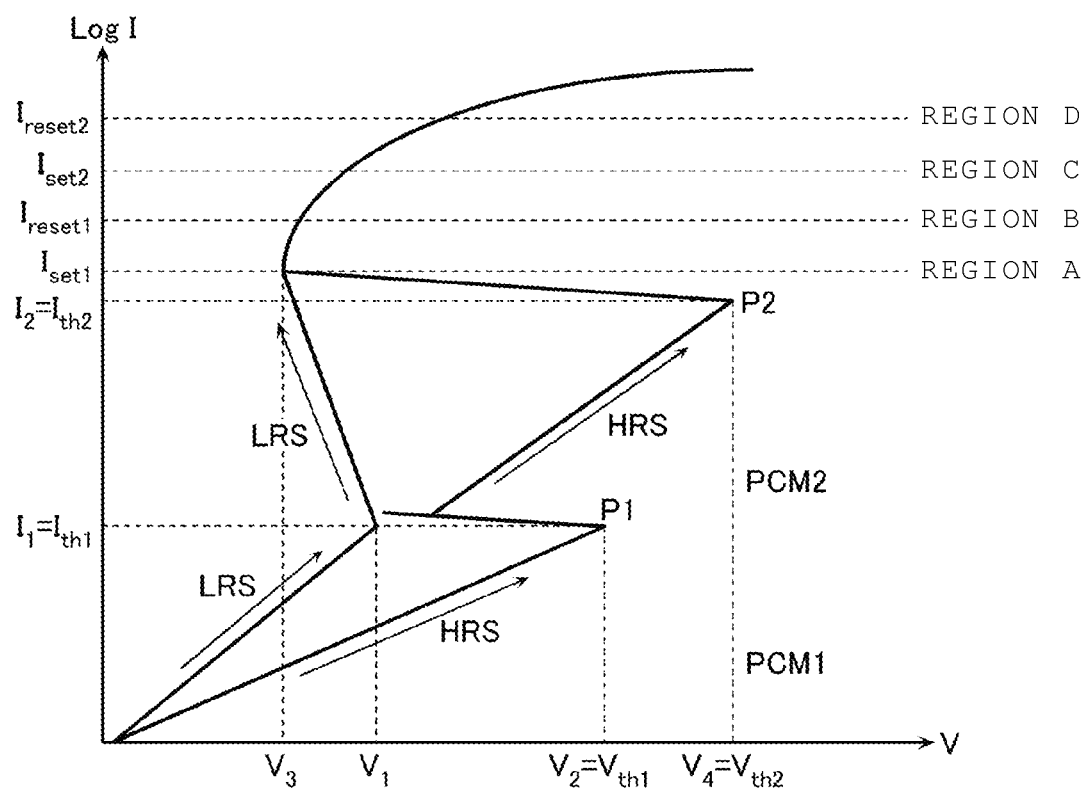
FIG. 5 is a graph illustrating a current-voltage characteristic of the memory cell.

FIG. 5 is a graph illustrating a current-voltage characteristic of the memory cell MC1. A horizontal axis indicates a voltage value applied to the memory cell MC1, and a vertical axis indicates a current value flowing through the memory cell MC1. It is noted that the vertical axis represents the current value in a logarithmic scale (log I).

As shown in FIG. 5, when the current flowing through the memory cell MC1 increases from 0 to a first current I1, a voltage appearing at both ends of the memory cell MC1 increases from 0 to a first voltage V1 when the PCM1 is in the LRS and increases from 0 to a second voltage V2 greater than the first voltage V1 when the PCM1 is in the HRS. It is noted that, as described above, since the resistance value of the PCM1 is greater than the resistance value of the PCM2, the current flowing through the memory cell MC1 is substantially determined by the resistance value of the PCM1.

When the PCM1 is in the HRS, when the current flowing through the memory cell MC1 reaches the first current I1 and the applied voltage reaches the second voltage V2, the voltage appearing at the both ends of the memory cell MC1 rapidly decreases. This phenomenon is referred to as a "snapback". When the PCM1 is in the HRS, the current I1 and the voltage V2 causing a first snapback P1 are referred to as a "first threshold current Ith1" and a "first threshold voltage Vth1".

Next, when the current flowing through the memory cell MC1 increases from the first current I1 to a second current I2, the voltage appearing at the both ends of the memory cell MC1 decreases to a third voltage V3 lower than the second voltage V2 when the PCM2 is in the LRS and increases to a fourth voltage V4 greater than the second voltage V2 when the PCM2 is in the HRS. It is noted that, since the PCM1 is in the low resistance state at this time, the current flowing through the memory cell MC1 is substantially determined by the resistance value of the PCM2.

When the PCM2 is in the HRS, when the current flowing through the memory cell MC1 reaches the second current I2 and the applied voltage reaches the fourth voltage V4, the PCM2 causes a second snapback P2, and the voltage appearing at the both ends of the memory cell MC1 rapidly decreases. The current I2 and the voltage V4 are referred to as a "second threshold current Ith2" and a "second threshold voltage Vth2".

It is noted that a current-voltage characteristic when both of the PCM1 and the PCM2 are in the LRS is substantially equal to a current-voltage characteristic of the selector layer 25. In other words, the characteristic of the memory cell MC1 shown in FIG. 5 is a characteristic obtained by superimposing the current-voltage characteristic of the selector layer 25 and the current-voltage characteristics of the PCM1 and the PCM2. As in this example, the PCM2 may exhibit a negative slope behavior when the PCM2 is in the LRS according to the current-voltage characteristic of the selector layer 25.

When the current flowing through the memory cell MC1 exceeds the second current I2, the PCM1 and the PCM2 are set or reset by applying a predetermined current supply pattern to the memory cell MC1 in a predetermined region. A region from a first set current Iset1 to a first reset current Ireset1 is region A, a region from the first reset current Ireset1 to a second set current Iset2 is region B, a region from the second set current Iset2 to a second reset current Ireset2 is region C, and a region exceeding the second reset current Ireset2 is region D. In the region A, the PCM1 is crystallized (set) by the predetermined current supply pattern. In the region B, the PCM1 becomes amorphous (reset) by the predetermined current supply pattern. In the region C, the PCM2 is crystallized (set) by the predetermined current supply pattern. In the region D, the PCM2 becomes amorphous (reset) by the predetermined current supply pattern.

Figure 6:
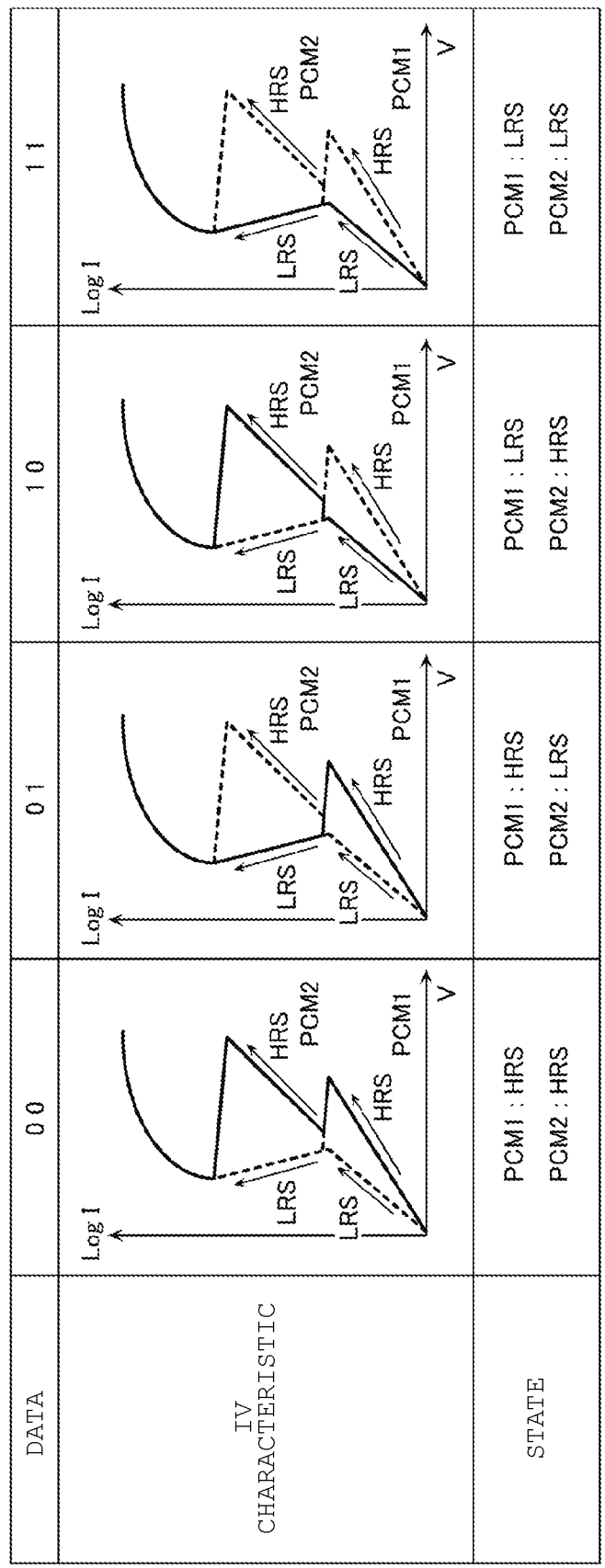
FIG. 6 is a diagram illustrating a relationship between data stored in the memory cell and the current-voltage characteristic.

FIG. 6 is a diagram illustrating a relationship between data of 2 bits stored in the memory cell MC1 and a current-voltage characteristic curve. The relationship between each piece of the data and the characteristic curve is as follows.

(1) Data "00"

When the PCM1 is in the HRS and the PCM2 is in the HRS, the case corresponds to data "00". The current-voltage characteristic is a solid line curve in which both of the PCM1 and the PCM2 undergo the snapback.

(2) Data "01"

When the PCM1 is in the HRS and the PCM2 is in the LRS, the case corresponds to data "01". The current-voltage characteristic is a solid line curve in which only the PCM1 undergoes the snapback.

(3) Data "10"

When the PCM1 is in the LRS and the PCM2 is in the HRS, the case corresponds to data "10". The current-voltage characteristic is a solid line curve in which only the PCM2 undergoes the snapback.

(4) Data "11"

When the PCM1 is in the LRS and the PCM2 is in the LRS, the case corresponds to data "11". The current-voltage characteristic is a solid line curve in which both of the PCM1 and the PCM2 do not undergo the snapback.

[Read Operation]

Next, a read operation of the memory cell using the above-described current-voltage characteristic will be described.

Figure 7:
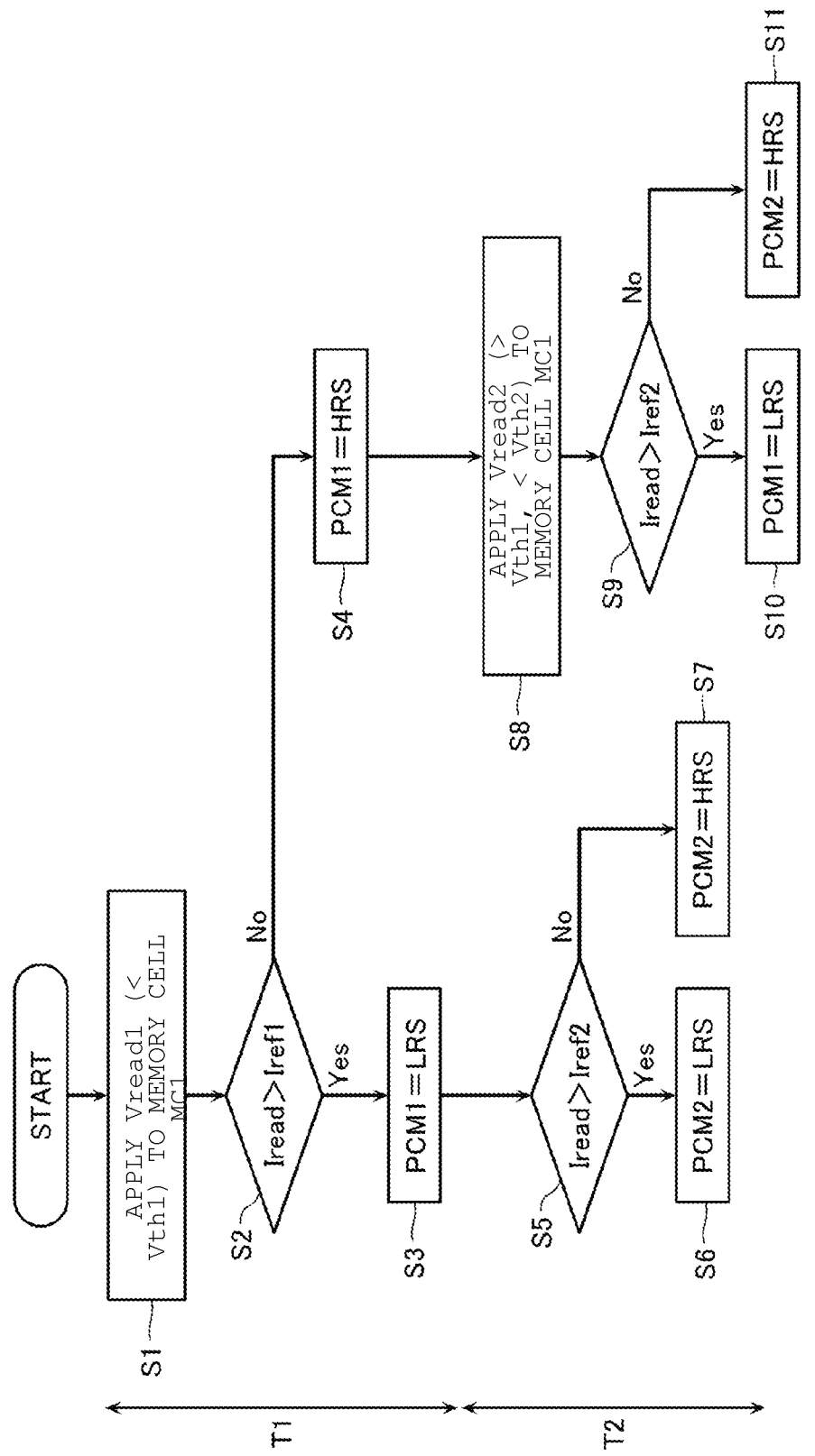
FIG. 7 is a flowchart illustrating a read operation in the semiconductor storage device.
Figure 8A:
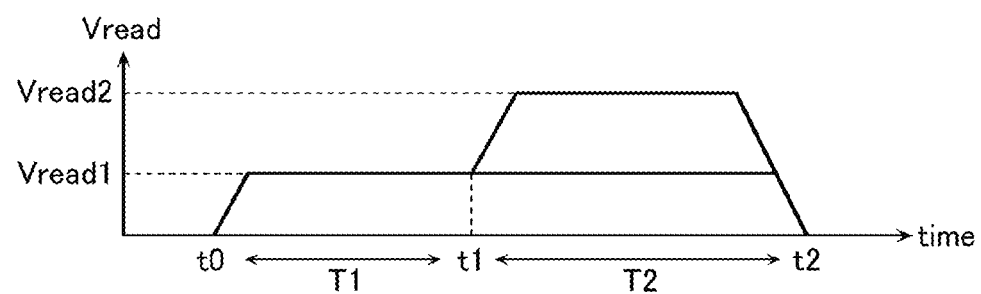
FIGS. 8A and 8B are waveform diagrams illustrating a voltage applied to the memory cell and a reference current at a time of the read operation.
Figure 8B:
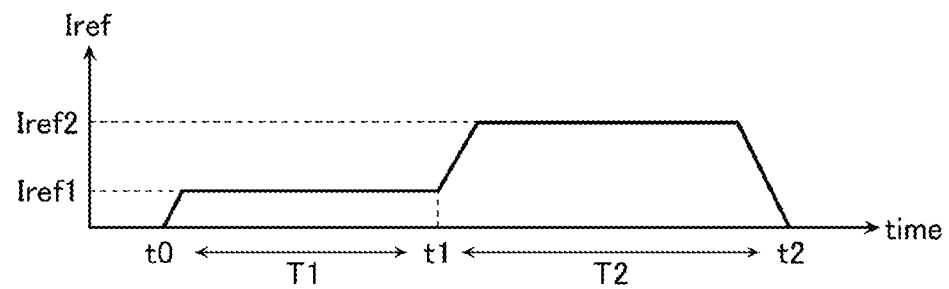
Figure 9:
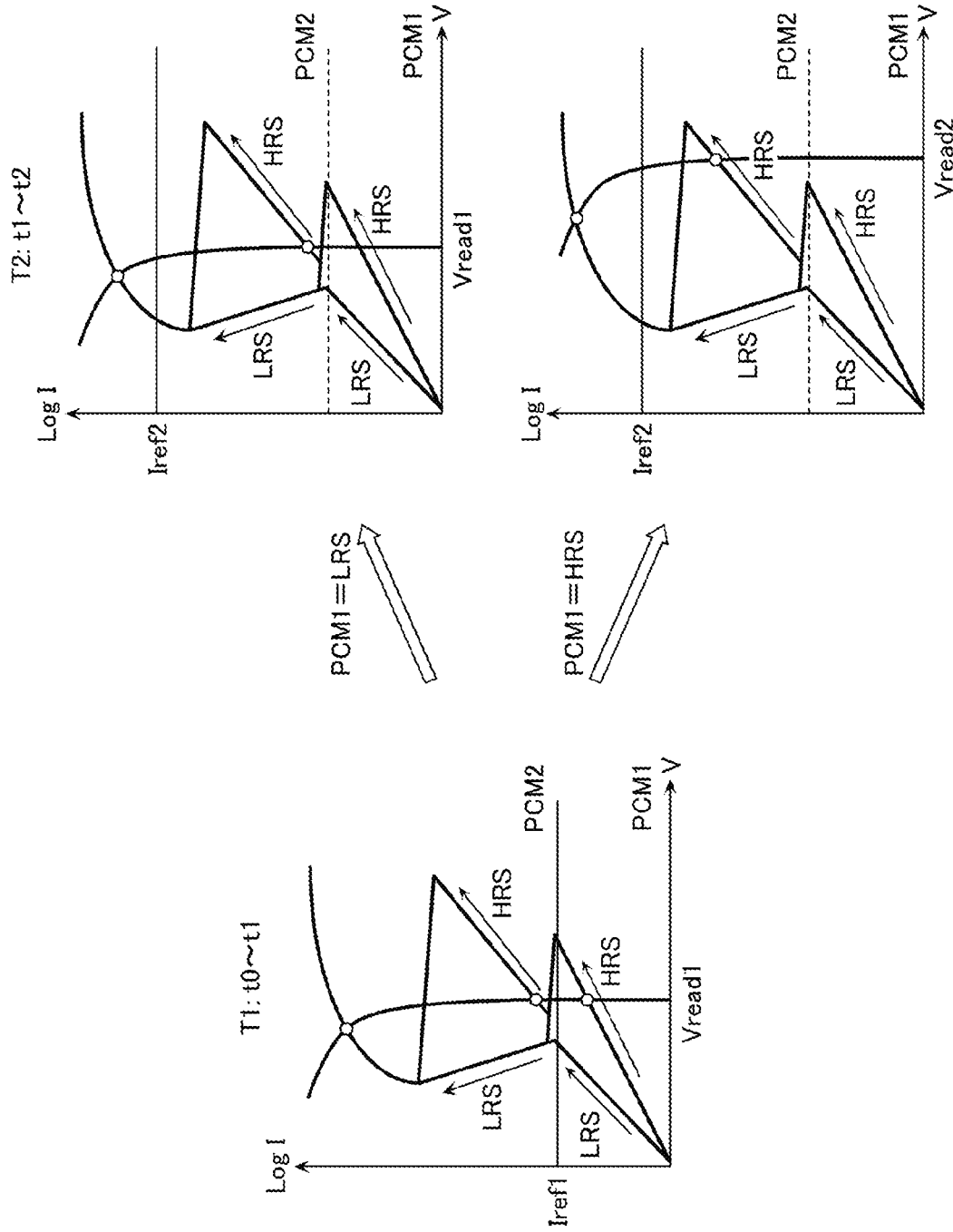
FIG. 9 is a diagram illustrating a relationship between the read operation and the current-voltage characteristic.

FIG. 7 is a flowchart illustrating the read operation in the control circuit 16 (see FIG. 1). FIGS. 8A and 8B illustrate waveforms of the voltage applied to the memory cell MC1 and a reference current compared with the current flowing through the memory cell MC1 at a time of the read operation. FIG. 9 illustrates a relationship between the read operation and the current-voltage characteristic of the memory cell MC1.

The read operation is a two-stage operation including a first operation in a first period T1 from a time t0 to a time t1 and a second operation in a second period T2 from the time t1 to a time t2.

In the first period T1, a first read voltage Vread1 is applied to the memory cell MC1 (S1), and a read current Iread flowing through the memory cell MC1 is compared with a first reference current Iref1 (S2). Here, the first read voltage Vread1 is set so as to satisfy V1<Vread1<Vth1 (=V2). In addition, the first reference current Iref1 is set to be substantially equal to the first current I1 (=Ith1). When Iread>Iref1 is satisfied, it is determined that the PCM1 is in the LRS (S3), and when Iread≤Iref1 is satisfied, it is determined that the PCM1 is in the HRS (S4).

When it is determined that the PCM1 is in the LRS, in the next second period T2, while maintaining the voltage applied to the memory cell MC1 at the first read voltage Vread1, the read current Iread is compared with a second reference current Iref2 (S5). Here, the second reference current Iref2 is set to be substantially equal to the second current I2 (=Ith2). When Iread>Iref2 is satisfied, it is determined that the PCM2 is in the LRS (S6), and when Iread≤Iref2 is satisfied, it is determined that the PCM2 is in the HRS (S7).

On the other hand, when it is determined that the PCM1 is in the HRS, in the second period T2, the voltage applied to the memory cell MC1 is increased to a second read voltage Vread2 (S8), and the read current Iread is compared with the second reference current Iref2 (S9). Here, the second read voltage Vread2 is set so as to satisfy Vth1 (=V2)<Vread2<Vth2 (=V4). When Iread>Iref2 is satisfied, it is determined that the PCM2 is in the LRS (S10), and when Iread≤Iref2 is satisfied, it is determined that the PCM2 is in the HRS (S11).

FIG. 10 illustrates an example of a read circuit that is able to be used for such a read operation. A voltage VWL is applied to the word line WL through a selection switch 41. On the other hand, a clamp voltage Vclamp applied to a gate of a clamp transistor 43 determines the voltage applied to the bit line BL. The first read voltage Vread1 or the second read voltage Vread2 is applied to the memory cell MC1 connected between the word line WL and the bit line BL by changing the clamp voltage Vclamp. The read current Iread flowing through the memory cell MC1 flows to an NMOS transistor 44 through the selection switch 42 and the clamp transistor 43. The NMOS transistor 44 forms a current mirror circuit together with an NMOS transistor 45. A constant current source 46 is connected to a drain side of the NMOS transistor 45 in series. Since the first reference current Iref1 or the second reference current Iref2 flows through the NMOS transistor 45 by the constant current source 46, a voltage VD on the drain side of the NMOS transistor 45 decreases at a time of Iread>Iref1 or Iref2 and increases at a time of Iread≤Iref1 or Iref2. The voltage VD is compared with a reference voltage Vref by a comparator 47, and thus a comparison result Vout is output.

[Effect]

When data is read using the memory cell in which the variable resistance films such as two types of phase change films having different resistance values are connected in series, generally, it is possible to determine four types of currents or voltages observed in a state in which a constant voltage is applied or a constant current flows. However, with this method, since the determination is made in four stages in one axial direction such as a current axis or a voltage axis, a read error is likely to occur.

To address this point, with the semiconductor storage device according to the first embodiment, data of two stages of each axis is determined using both the voltage axis and the current axis while focusing on the current-voltage characteristic of the memory cell MC1 having the two variable resistance films 23 and 27, of which the threshold voltages and the threshold currents causing the snapback are different, connected in series. Therefore, there is an effect that a read error is less likely to occur than in the above-described general method.

[Write Operation]

FIGS. 11A and 11B illustrate a current supply pattern indicating the write operation of the semiconductor storage device according to the first embodiment.

(1) Write of data "00"

When data "00" (PCM1: HRS, PCM2: HRS) is written, as shown in (a) of FIG. 11A, at the time t0, a write current Iprog of the region D exceeding the second reset current Ireset2 is caused to flow, and thus the PCM2 is caused to be in a molten state. At this time, since a melting point of the PCM1 is lower than a melting point of the PCM2, the PCM1 also becomes the molten state at the same time. The PCM1 and the PCM2 are then rapidly cooled by rapidly lowering the current value at the time t1 to cause the PCM1 and the PCM2 to be in an amorphous state. Therefore, both the PCM1 and the PCM2 go into the HRS.

(2) Write of data "01"

When data "01" (PCM1: HRS, PCM2: LRS) is written, as shown in (b) of FIG. 11A, at the time t0, a write current Iprog of the region C exceeding the second set current Iset2 is caused to flow, and thus the PCM2 is caused to be in the crystalline state. At this time, since the melting point of the PCM1 is lower than the crystallization temperature of the PCM2, the PCM1 is in the molten state. The write current Iprog is initially slowly lowered and then rapidly lowered until the time t2 to cause the PCM1 to be in the amorphous state and the PCM2 to be in the crystalline state. Therefore, the PCM1 goes into the HRS and the PCM2 goes into the LRS.

(3) Write of data "10"

When data "10" (PCM1: LRS, PCM2: HRS) is written, as shown in (c) of FIG. 11B, the write current Iprog is caused to flow in the region D exceeding the second reset current Ireset2 at the time t0, and thus the PCM2 is caused to be in the molten state. At this time, since the melting point of the PCM1 is lower than the melting point of the PCM2, the PCM1 is also caused to be in the molten state at the same time. Next, at the time t1, the write current Iprog is rapidly lowered to the region A equal to or less than the first reset current Ireset1. Therefore, the PCM2 is rapidly cooled to be caused to be in the amorphous state. In this state, when the write current Iprog is held at the current value of the region A and the current is slowly lowered until a time t3, the PCM1 is crystallized. Therefore, the PCM1 goes into the LRS and the PCM2 goes into the HRS.

(4) Write of data "11"

When data "11" (PCM1: LRS, PCM2: LRS) is written, as shown in (d) of FIG. 11B, at the time t0, the write current Iprog is caused to flow in the region C exceeding the second set current Iset2, the current value is slowly lowered until the time t2, and thus the PCM2 is caused to be in the crystalline state. At this time, since the melting point of the PCM1 is lower than the crystallization temperature of the PCM2, the PCM1 becomes in the molten state. At the time t2, the current value of the write current Iprog is lowered to the current value of the region A exceeding the first set current Iset1. The current value is further slowly lowered until the time t3 to crystallize the PCM1. Therefore, both the PCM1 and the PCM2 go into the LRS.

As described above, with the semiconductor storage device according to the present embodiment, four current patterns obtained by combining four types of current values are set in consideration of different melting points and crystallization temperatures of the PCM1 and the PCM2, and the current patterns are supplied to the memory cell MC1. Therefore, it is possible to write four different states in the memory cell MC1.

[Second Embodiment]

Figure 12:
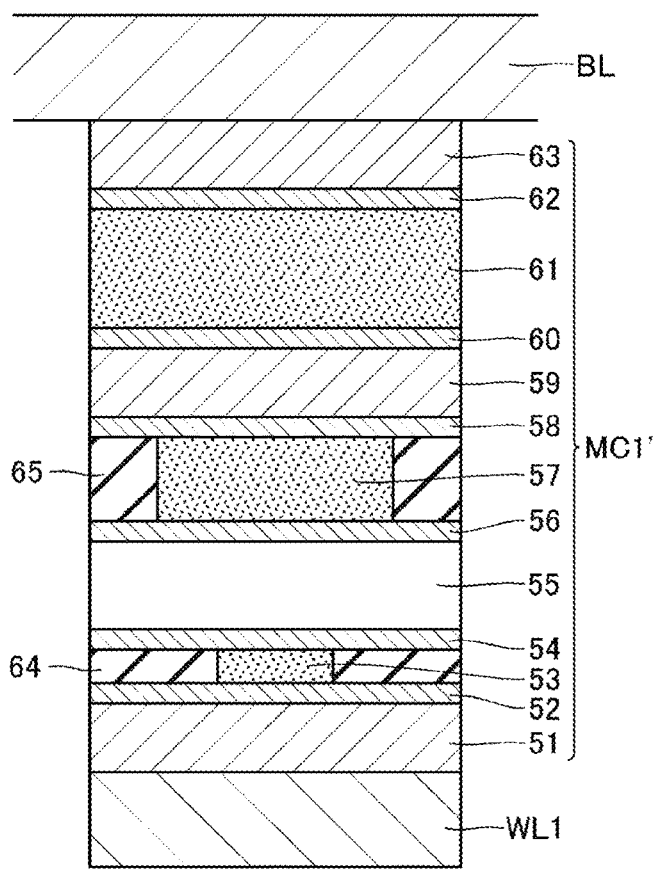
FIG. 12 is a cross-sectional view illustrating a configuration of a memory cell of a semiconductor storage device according to a second embodiment.

FIG. 12 is a cross-sectional view illustrating a configuration of a memory cell MC1' of the semiconductor storage device according to the second embodiment.

The first embodiment shows a multi-level cell (MLC) of 2 bits using the two variable resistance films 23 and 27. The second embodiment shows an example of a triple-level cell (TLC) of 3 bits using three variable resistance films.

As shown in FIG. 12, the memory cell MC1' in the semiconductor storage device of the present embodiment includes a lower electrode layer 51, a barrier metal layer 52, a first variable resistance film (PCM1) 53, a barrier metal layer 54, a selector layer (SEL) 55, a barrier metal layer 56, a second variable resistance film (PCM2) 57, a barrier metal layer 58, an intermediate electrode layer 59, a barrier metal layer 60, a third variable resistance film (PCM3) 61, a barrier metal layer 62, and an upper electrode layer 63, that are sequentially stacked in order from side of the word line WL1 toward the side of the bit line BL.

Physical characteristics of the first variable resistance film 53, the second variable resistance film 57, and the third variable resistance film 61 are different from one another because their volumes are different from one another. Therefore, insulating layer 64 and 66 are provided in a portion where the first variable resistance film 53 does not exist between the barrier metal layers 52 and 54 and a portion where the second variable resistance film 57 does not exist between the barrier metal layers 56 and 58, respectively. It is noted that, instead of or in addition to making the volumes of the first, second, and third variable resistance films 53, 57 and 61 be different from one another, the physical characteristics of the three variable resistance films may be different from one another because they are made of materials different from one another.

[Physical Characteristic of Memory Cell and Read Operation]

Next, the physical characteristic and the read operation of the memory cell MC1' in the present embodiment will be described. It is noted that, in the following description, the first variable resistance film 53 may be referred to as "PCM1", the second variable resistance film may be referred to as "PCM2", the third variable resistance film 61 may be referred to as "PCM3", a case where the PCM1, the PCM2, and the PCM3 are in the low resistance state may be referred to as "LRS", and a case where the PCM1, the PCM2, and the PCM3 are in the high resistance state may be referred to as "HRS".

Figure 13:
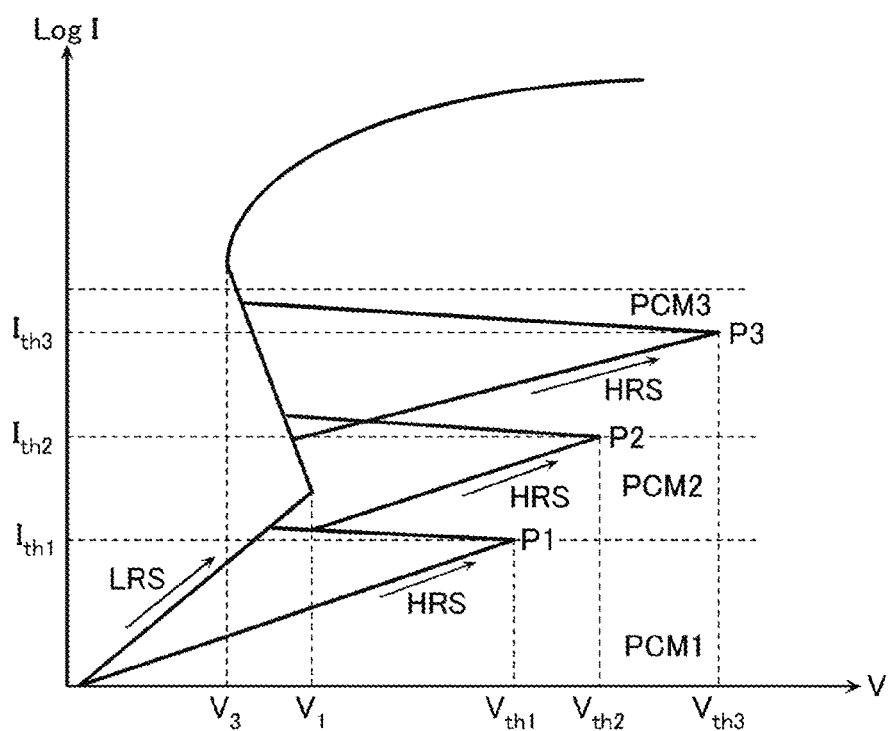
FIG. 13 is a graph illustrating a current-voltage characteristic of the memory cell.

FIG. 13 is a graph illustrating a current-voltage characteristic of the memory cell MC1'. In addition to the first and second snapbacks P1 and P2 generated in the memory cell MC1 of the first embodiment, in the present embodiment, a third snapback P3 by the PCM3 occurs. Here, a current value and a voltage value at which the third snapback P3 occurs are referred to as a "third threshold current Ith3" and a "third threshold voltage Vth3". A relationship between the first and second threshold currents Ith1 and Ith2 and the first and second threshold voltages Vth1 and Vth2 is as follows.

$$Ith1 < Ith2 < Ith3$$

$$Vth1 < Vth2 < Vth3$$

Next, a read operation will be described with reference to FIGS. 14A to 14G.

First, as shown in (a), a first read voltage Vread1 is applied to the memory cell MC1', and the read current Iread flowing through the memory cell MC1' is compared with the first reference current Iref1. Here, the first read voltage Vread1 is set so as to satisfy V1<Vread1<Vth1. In addition, the first reference current Iref1 is set to be substantially equal to the first threshold current Ith1. When Iread>Iref1 is satisfied, it is determined that the PCM1 is in the LRS, and when Iread≤Iref1 is satisfied, it is determined that the PCM1 is in the HRS.

As shown in (b), when it is determined that the PCM1 is in the LRS, while maintaining the voltage applied to the memory cell MC1' at the first read voltage Vread1, the read current Iread is compared with the second reference current Iref2. Here, the second reference current Iref2 is set to be substantially equal to the second threshold current Ith2. When Iread>Iref2 is satisfied, it is determined that the PCM2 is in the LRS, and when Iread≤Iref2 is satisfied, it is determined that the PCM2 is in the HRS.

On the other hand, as shown in (c), when it is determined that the PCM1 is in the HRS, the voltage applied to the memory cell MC1' is increased to the second read voltage Vread2 and the read current Iread is compared with the second reference current Iref2. Here, the second read voltage Vread2 is set so as to satisfy Vth1<Vread2<Vth2. When Iread>Iref2 is satisfied, it is determined that the PCM2 is in the LRS, and when Iread≤Iref2 is satisfied, it is determined that the PCM2 is in the HRS.

As shown in (d), when it is determined that both of the PCM1 and the PCM2 are in the LRS, while maintaining the voltage applied to the memory cell MC1' at the first read voltage Vread1, the read current Iread is compared with a third reference current Iref3. Here, the third reference current Iref3 is set to be substantially equal to the third threshold current Ith3. When Iread>Iref3 is satisfied, it is determined that the PCM3 is in the LRS, and when Iread ≤Iref3 is satisfied, it is determined that the PCM3 is in the HRS.

As shown in (e), when it is determined that the PCM1 is in the LHS and the PCM2 is in the HRS, the voltage applied to the memory cell MC1' is increased to a third read voltage Vread3 and the read current Iread is compared with the third reference current Iref3. Here, the third read voltage Vread3 is set so as to satisfy Vth2<Vread3<Vth3. When Iread>Iref3 is satisfied, it is determined that the PCM3 is in the LRS, and when Iread≤Iref3 is satisfied, it is determined that the PCM3 is in the HRS.

As shown in (f), when it is determined that the PCM1 is in the HRS and the PCM2 is in the LRS, while maintaining the voltage applied to the memory cell MC1' at the second read voltage Vread2, the read current Iread is compared with the third reference current Iref3. When Iread>Iref3 is satisfied, it is determined that the PCM3 is in the LRS, and when Iread≤Iref3 is satisfied, it is determined that the PCM3 is in the HRS.

As shown in (g), when it is determined that both of the PCM1 and the PCM2 are in the HRS, the voltage applied to the memory cell MC1' is increased to the third read voltage Vread3 and the read current Iread is compared with the third reference current Iref3. When Iread>Iref3 is satisfied, it is determined that the PCM3 is in the LRS, and when Iread≤Iref3 is satisfied, it is determined that the PCM3 is in the HRS.

[Effect]

As described above, with the semiconductor storage device according to the second embodiment, data of three stages of each axis is determined using both of the voltage axis and the current axis while focusing on the current-voltage characteristic of the memory cell MC1' having the three variable resistance films 53, 57, and 61, of which the threshold voltages and the threshold currents causing the snapback are different, connected in series. Therefore, there is an effect that a read error is less likely to occur than a determination of nine stages in one axial direction.

[Third Embodiment]

FIGS. 15 to 19 are diagrams for explaining the semiconductor storage device according to a third embodiment. The third embodiment is an example in which the memory cell MC1 of the first embodiment is applied to ternary content addressable memory (TCAM). In the TCAM, search data and storage data are searched in parallel and a matched address is output.

Figure 15:
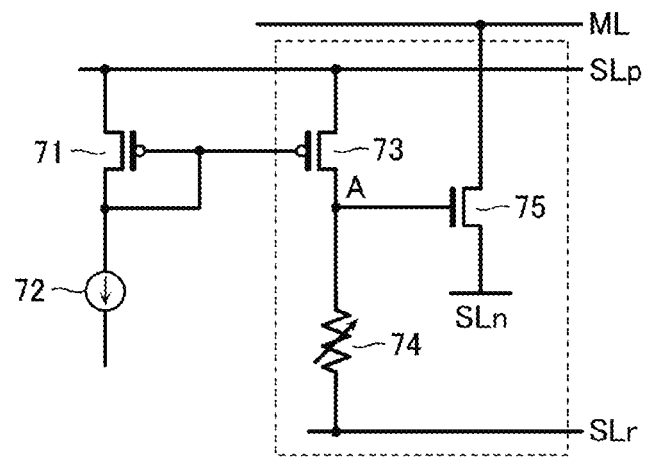
FIG. 15 is a circuit diagram illustrating a TCAM cell of a semiconductor storage device according to a third embodiment.

FIG. 15 is a circuit diagram illustrating a configuration of a TCAM cell. Sources of PMOS transistors 71 and 73 are connected to a search line SLp, and gates of the PMOS transistors 71 and 73 are commonly connected to each other and to a drain of a PMOS transistor 71, to form a current mirror circuit. A current source 72 is connected to the drain of the PMOS transistor 71. A drain of the PMOS transistor 73 is connected to a search line SLr through a memory cell 74 similar to that of the first embodiment. The drain of the PMOS transistor 73 is connected to a gate of an NMOS transistor 75. A drain of the NMOS transistor 75 is connected to a match line ML, and a source of the NMOS transistor 75 is connected to a search line SLn.

Figure 16:
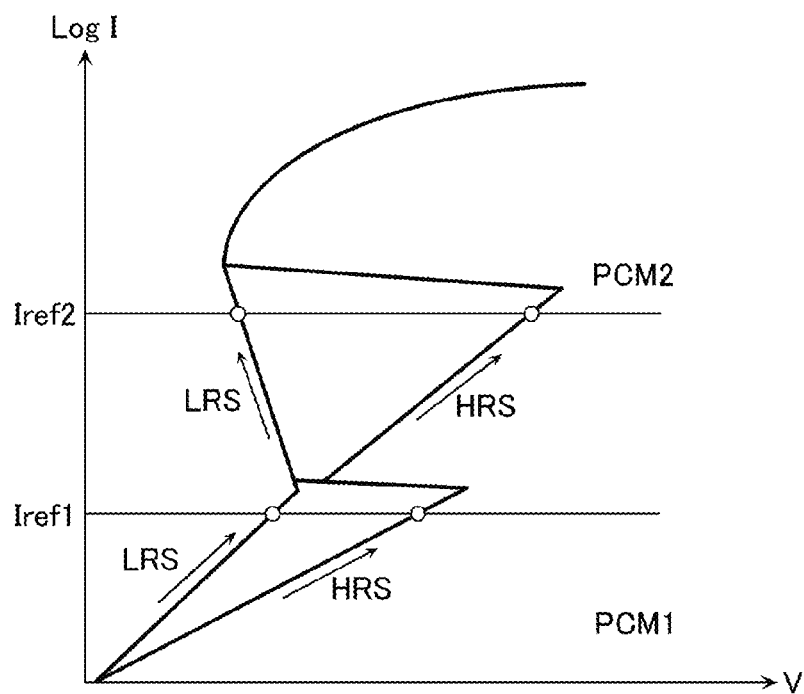
FIG. 16 is a graph illustrating the current-voltage characteristic of the memory cell of the semiconductor storage device.

FIG. 16 illustrates a current-voltage characteristic of the memory cell 74. It is noted that the first reference current Iref1 is set to be less than the first threshold current Ith1, and the second reference current Iref2 is set to be a current value greater than the first reference current Iref1 and less than the second threshold current Ith2. When the first reference current Iref1 flows from the current source 72, the voltage across both ends of the memory cell 74 when the PCM1 is in the HRS is greater than that when the PCM1 is in the LRS. In addition, when the second reference current Iref2 flows from the current source 72, the voltages at the both ends of the memory cell 74 when the PCM2 is in the HRS are greater than those when the PCM2 is in the LRS. Since a voltage at a connection point A between the PMOS transistor 73 and the memory cell 74 is switched to a high level or a low level due to such a voltage difference, the NMOS transistor 75 is switched on or off.

Figures 17, 18:
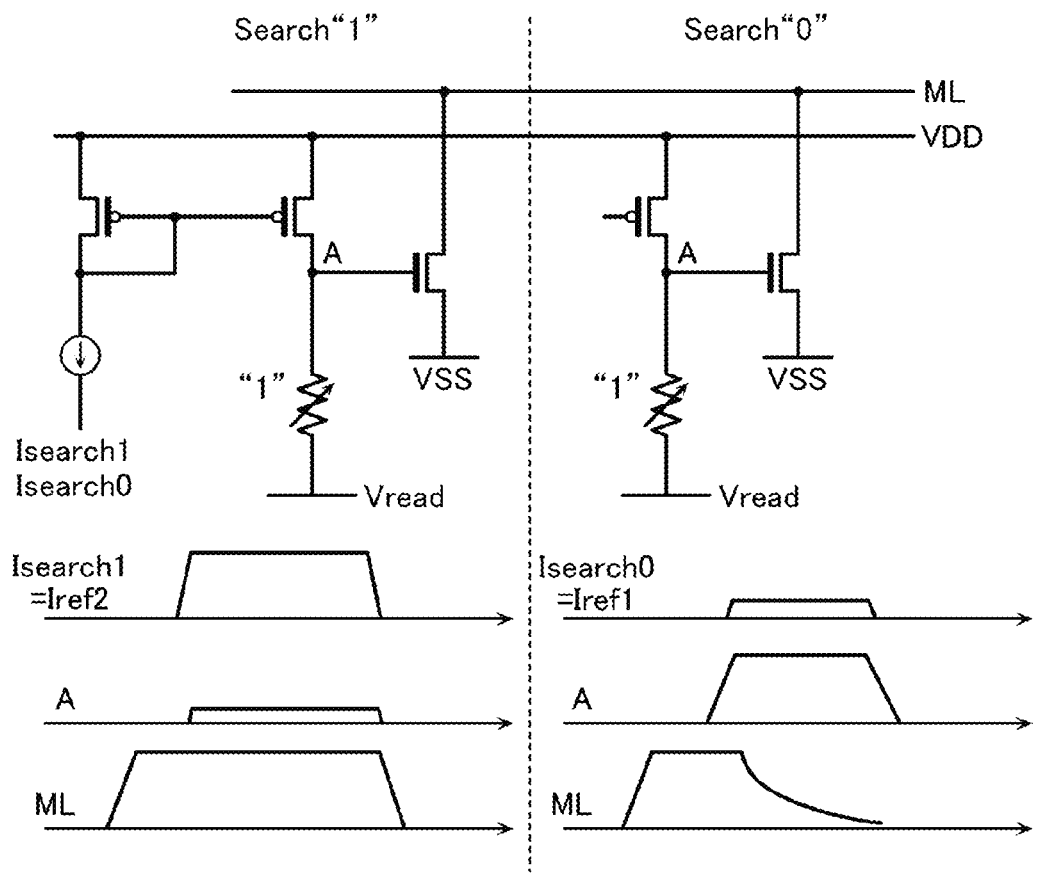
FIG. 17 is a diagram illustrating the states of different data stored in the memory cell.
FIG. 18 is a diagram illustrating an operation of the TCAM cell.

FIG. 17 illustrates a correspondence between states of the PCM1 and the PCM2 and the stored data. A state in which both of the PCM1 and the PCM2 are in the LRS corresponds to data "X" ("Don't care"). A state in which the PCM1 is in the LRS and the PCM2 is in the HRS corresponds to data "0". A state in which the PCM1 is in the HRS and the PCM2 is in the LRS corresponds to data "1". A state in which both of the PCM1 and the PCM2 are in the HRS is not used ("N/A").

In such a TCAM cell, for example, as shown in FIG. 18, a power source voltage VDD and a ground voltage VSS are respectively applied to the search lines SLp and SLn, and the read voltage Vread is applied to the search line SLr, to cause the second reference current Iref2 as a search current Isearch1 for searching the data "1" to flow through the current source 72. It is noted that, for example, the read voltage Vread is set to be a voltage value of a level at which the voltage appearing at the both ends of the memory cell 74 when both of the PCM1 and the PCM2 are in the LRS is canceled and the NMOS transistor 75 is not turned on. When the data "1" is held in the memory cell 74, since the PCM2 is in the LRS, the voltage at the point A becomes a low level and the NMOS transistor 75 is turned off. As a result, since a voltage of the match line ML maintains a pre-charge voltage, a "data match" state is established.

On the other hand, when the first reference current Iref1 is caused to flow through the current source 72 as the search current Isearch0 for searching the data "0", when the data "1" is held in the memory cell 74, since the PCM1 is in the HRS, the voltage of the point A becomes the high level, and the NMOS transistor 75 is turned on. As a result, since the voltage of the match line ML is discharged, a "data mismatch" state is established.

It is noted that when the data "0" is held in the memory cell 74, the "data match" state is established at the search current Isearch0 and the "data mismatch" state is established at the search current Isearch1. In addition, when the data "X" is held in the memory cell 74, the "data match" occurs even though any of the search currents Isearch0 and Isearch1 is caused to flow.

Figure 19:
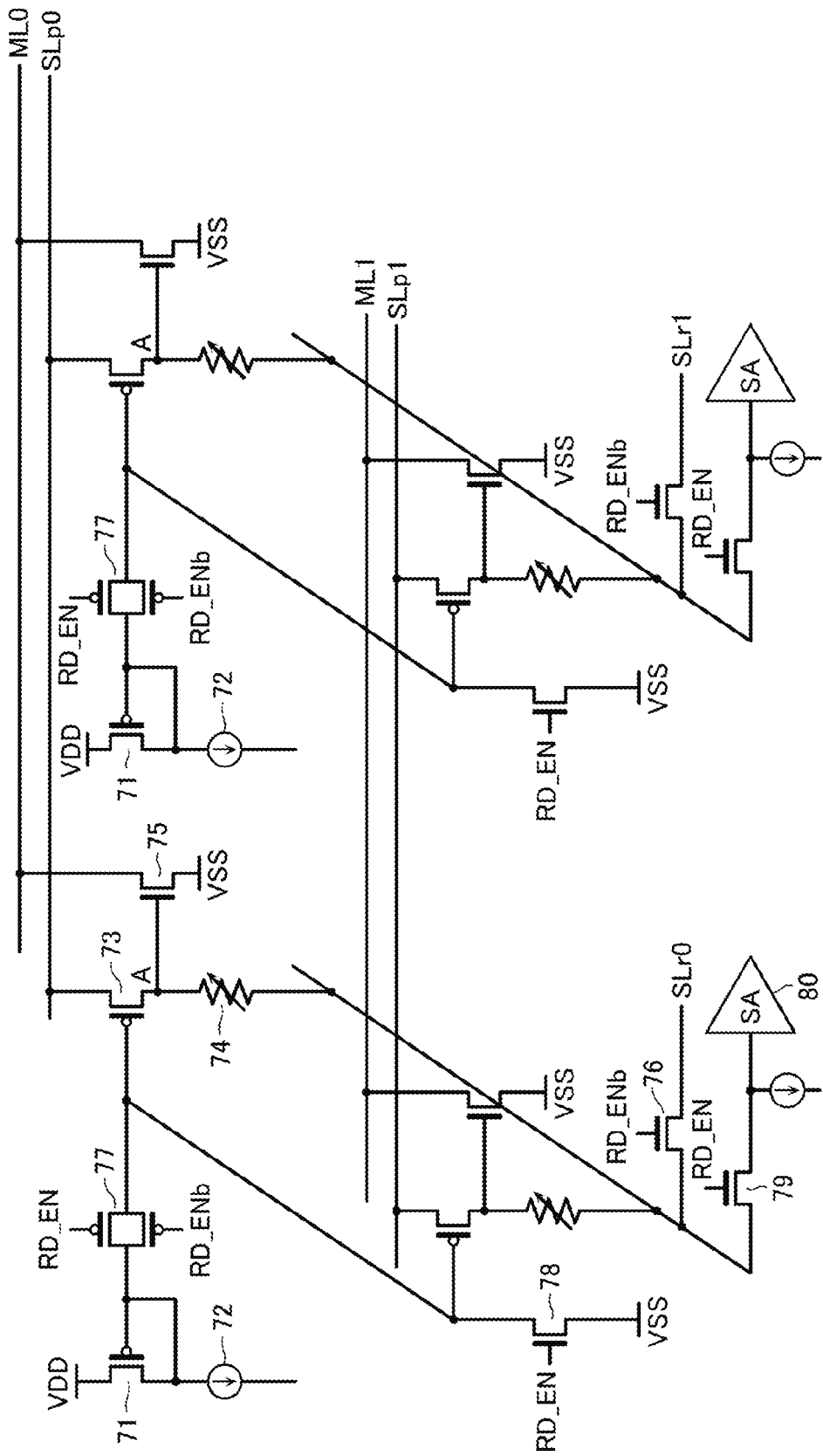
FIG. 19 is a circuit diagram of the semiconductor storage device.

FIG. 19 is a circuit diagram illustrating a specific configuration of such a TCAM.

Data to be compared with reference data is stored in a set of the TCAM cells connected to the same match line MLi (i=0, 1, . . . , the same will be applied below) and a search line SLpi. A switch 77 is connected between the PMOS transistors 71 and 73 configuring the current mirror circuit of the TCAM cell. The gate of the PMOS transistors 73 is commonly connected to a plurality of TCAM cells arranged in a direction intersecting with the match line MLi and the search line SLi, and an application end of the read voltage Vread of the memory cell 74 is commonly connected to the plurality of TCAM cells. An NMOS transistor 78 is connected between a common connection point of the PMOS transistor 73 and a ground end (VSS). A voltage is applied to a common connection end of the memory cell 74 through an NMOS transistor 76. In addition, an input terminal of a sense amplifier 80 is connected to the common connection end of the memory cell 74 through an NMOS transistor 79.

[Write Operation]

When data is written to the memory cell 74, a write operation is performed for each set of the TCAM cells. A voltage VDD is applied to the search line SLpi to which a set of a selected TCAM cell is connected, and the search line SLpj (j≠i, the same will be applied below) to which a set of a non-selected TCAM cell is connected is set to the voltage VSS. The NMOS transistor 76 is turned on and a write voltage Vwrite is applied to one end of the memory cell 74. The switch 77 is turned on. Then, for each memory cell 74 of the selected TCAM cell, the current source 72 is driven to perform writing by a current pattern according to the written data as described using FIGS. 11A and 11B.

[Search Operation]

When the search operation is performed, all the match lines ML are pre-charged to a voltage Vprchg. The voltage VDD is applied to all the search lines SLp. The NMOS transistor 76 is turned on and the read voltage Vread is applied to one end of the memory cell 74. The switch 77 is turned on. Then, for each memory cell, the search currents Isearch0 and Isearch1 corresponding to the search data are supplied from the current source 72. As a result, only the match line ML connected to the set of TCAM cell that is matched with all the reference data maintains the voltage Vprchg, and the match line ML connected to the set where even one TCAM cell which is not matched with the reference data is present becomes zero level. Therefore, matched match lines are output as address data.

[Read Operation]

When data is read, the read operation is performed for each set of the TCAM cells. The voltage VDD is applied to the search line SLpi to which the set of the selected TCAM cell is connected and the search line SLpj to which the set of the non-selected TCAM cell is connected is set to the voltage VSS. The NMOS transistor 78 is turned on and the PMOS transistor 73 is turned on. The switch 77 is turned off. The NMOS transistor 79 is turned on, one end of the memory cell 74 is connected to the voltage VDD, and the other end is connected to the sense amplifier 80. The data of the memory cell 74 is read through the sense amplifier 80.

As described above, according to the present embodiment, it is possible to provide a TCAM having a configuration simpler than that of a TCAM of the related art using an SRAM cell.

It is noted that, in the above example, the case where both of the PCM1 and the PCM2 are in the LRS corresponds to the data "X", the case where the PCM1 is in the LRS and the PCM2 is in the HRS corresponds to the data "0", and the case where the PCM1 is in the HRS and the PCM2 is in the LRS corresponds to the data "1". However, a case where both of the PCM1 and the PCM2 are in the HRS may correspond to the data "X", a case where the PCM1 is in the HRS and the PCM2 is in the LRS may correspond to the data "0", and a case where the PCM1 is in the LRS and the PCM2 is in the HRS may correspond to the data "1", by changing the circuit shown in FIG. 15.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a memory cell having
        a first variable resistance element changeable from a first state to a second state at which a resistance value of the first variable resistance element is higher than that of the first variable resistance element at the first state, and
        a second variable resistance element electrically connected to the first variable resistance element in series and changeable from a third state to a fourth state at which a resistance value of the second variable resistance element is higher than that of the second variable resistance element at the third state,
    wherein, in the memory cell,
        a first snapback occurs at a first threshold current and a first threshold voltage, and
        a second snapback occurs at a second threshold current that is greater than the first threshold current and a second threshold voltage that is greater than the first threshold voltage, and
    wherein the first and second variable resistance elements include a chalcogenide material.

2. The semiconductor storage device according to claim 1, wherein
    a voltage across both ends of the memory cell when a first current less than the first threshold current flows through the memory cell is a first voltage when the first variable resistance element is in the first state, and is a second voltage greater than the first voltage and less than the first threshold voltage when the first variable resistance element is in the second state, and
    a voltage across both ends of the memory cell when a second current greater than the first threshold current and less than the second threshold current flows through the memory cell is a third voltage when the second variable resistance element is in the third state, and is a fourth voltage greater than the third voltage and less than the second threshold voltage when the second variable resistance element is in the fourth state.

3. The semiconductor storage device according to claim 1, wherein
    the memory cell includes a plurality of layers including a selector layer, and
    the first and second variable resistance elements are respectively in layers above and below the selector layer.

4. The semiconductor storage device according to claim 3, wherein the first and second variable resistance elements are made of the same material and have different volumes.

5. The semiconductor storage device according to claim 3, wherein the first and second variable resistance elements are made of different materials.

6. The semiconductor storage device according to claim 3, wherein the first and second variable resistance elements have different volumes.

7. The semiconductor storage device according to claim 3, wherein the memory cell further includes a third variable resistance element electrically connected to the first and second variable resistance elements in series and changeable from a fifth state to a sixth state at which a resistance value of the third variable resistance element is higher than that of the third variable resistance element at the third state.

8. The semiconductor storage device according to claim 7, wherein the plurality of layers includes an electrode layer between the third variable resistance element and the second variable resistance element.

9. The semiconductor storage device according to claim 1, wherein
    a resistance value of the first variable resistance element is higher than a resistance value of the second variable resistance element, and a melting temperature of the first variable resistance element is lower than a melting temperature of the second variable resistance element.

10. The semiconductor storage device according to claim 1, wherein each memory cell further comprises:
a selector layer between the first variable resistance element and the first variable resistance element,
a width of the first variable resistance element is less than a width of the selector layer, and
a width of the second variable resistance element is equal to the width of the selector layer.

11. The semiconductor storage device according to claim 10, wherein the selector layer includes a PIN diode.

12. The semiconductor storage device according to claim 10, further comprising:
a first word line below the memory cell;
a first bit line above the memory cell;
a second memory cell above the first bit line; and
a second word line above the second memory cell, wherein
the second memory cell includes the first variable resistance element, the second variable resistance element, and the selector layer.

13. A semiconductor storage device comprising:
a plurality of first word lines at a first level above a substrate;
a plurality of bit lines at a second level above the substrate and above the first level;
a plurality of second word lines at a third level above the substrate and above the second level;
a plurality of first memory cells at intersections of the first word lines and the bit lines; and
a plurality of second memory cells at intersections of the second word lines and the bit lines,
wherein each of the first and second memory cells includes
a first variable resistance element changeable from a first state to a second state at which a resistance value of the first variable resistance element is higher than that of the first variable resistance element at the first state, and
a second variable resistance element connected to the first variable resistance element in series and changeable from a third state to a fourth state at which a resistance value of the second variable resistance element is higher than that of the second variable resistance element at the third state, and
wherein, each of the first and second memory cells,
a first snapback occurs at a first threshold current and a first threshold voltage, and
a second snapback occurs at a second threshold current that is greater than the first threshold current and a second threshold voltage that is greater than the first threshold voltage, and
wherein the first and second variable resistance elements include a chalcogenide material.

14. The semiconductor storage device according to claim 13, wherein
a voltage across both ends of the memory cell when a first current less than the first threshold current flows through the memory cell is a first voltage when the first variable resistance element is in the first state, and is a second voltage greater than the first voltage and less than the first threshold voltage when the first variable resistance element is in the second state, and
a voltage across both ends of the memory cell when a second current greater than the first threshold current and less than the second threshold current flows through the memory cell is a third voltage when the second variable resistance element is in the third state, and is a fourth voltage greater than the third voltage and less than the second threshold voltage when the second variable resistance element is in the fourth state.

15. The semiconductor storage device according to claim 14, wherein
the memory cell includes a plurality of layers including a selector layer, and
the first and second variable resistance elements are respectively in layers above and below the selector layer.

16. The semiconductor storage device according to claim 15, wherein the first and second variable resistance elements are made of the same material and have different volumes.

17. The semiconductor storage device according to claim 15, wherein the first and second variable resistance elements are made of different materials.

18. The semiconductor storage device according to claim 15, wherein the first and second variable resistance elements have different volumes.

19. The semiconductor storage device according to claim 15, wherein the memory cell further includes a third variable resistance element electrically connected to the first and second variable resistance elements in series and changeable from a fifth state to a sixth state at which a resistance value of the third variable resistance element is higher than that of the third variable resistance element at the third state.

20. The semiconductor storage device according to claim 19, wherein the plurality of layers includes an electrode layer between the third variable resistance element and the second variable resistance element.

21. A method of reading data from a memory cell of a semiconductor storage device, the memory cell having a first variable resistance element changeable from a first state to a second state at which a resistance value of the first variable resistance element is higher than that of the first variable resistance element at the first state, and a second variable resistance element electrically connected to the first variable resistance element in series and changeable from a third state to a fourth state at which a resistance value of the second variable resistance element is higher than that of the second variable resistance element at the third state, wherein the first and second variable resistance elements include a chalcogenide material, the method comprising:
detecting a first read current flowing through the memory cell when a first read voltage is applied to the memory cell, wherein the first read voltage is greater than the voltage across both ends of the memory cell when the first threshold current flows through the memory cell and is less than the first threshold voltage when the first variable resistance element is in the first state;
determining that the first variable resistance element is in the first state when the first read current is greater than a first reference current, comparing the first read current with a second reference current greater than the first reference current while applying the first read voltage to the memory cell, determining that the second variable resistance element is in the third state when the first read current is greater than the second reference current, and determining that the second variable resistance element is in the fourth state when the first read current is equal to or less than the second reference current; and
determining that the first variable resistance element is in the second state when the first read current is equal to or less than the first reference current, applying a second read voltage greater than the first threshold voltage and less than the second threshold voltage to the memory cell to detect a second read current flowing through the memory cell, determining that the second variable resistance element is in the third state when the second read current is greater than the second reference current, and determining that the second variable resistance element is in the fourth state when the second read current is equal to or less than the second reference current.

22. The method according to claim 21, wherein
the memory cell includes a plurality of layers including a selector layer, and
the first and second variable resistance elements are respectively in layers above and below the selector layer, are made of the same material, and have different volumes.

* * * * *